(12) United States Patent
Tillkorn et al.

(10) Patent No.: US 11,791,605 B2
(45) Date of Patent: Oct. 17, 2023

(54) DIODE LASER ASSEMBLY AND DWM MODULE HAVING A DIODE LASER ASSEMBLY OF THIS TYPE

(71) Applicant: TRUMPF Photonics, Inc., Cranbury, NJ (US)

(72) Inventors: Christoph Tillkorn, Villingendorf (DE); Stephan Strohmaier, Berlin (DE); Steffen Ried, Rottweil (DE)

(73) Assignee: TRUMPF Photonics, Inc, Cranbury, NJ (US)

( * ) Notice: Subject to any disclaimer, the term of this patent is extended or adjusted under 35 U.S.C. 154(b) by 423 days.

(21) Appl. No.: 17/254,616

(22) PCT Filed: Jun. 18, 2019

(86) PCT No.: PCT/EP2019/066006
§ 371 (c)(1),
(2) Date: Dec. 21, 2020

(87) PCT Pub. No.: WO2019/243325
PCT Pub. Date: Dec. 26, 2019

(65) Prior Publication Data
US 2021/0126426 A1    Apr. 29, 2021

(30) Foreign Application Priority Data
Jun. 21, 2018 (DE) .......................... 102018210139.6

(51) Int. Cl.
*H01S 5/024* (2006.01)
*H01S 5/40* (2006.01)

(52) U.S. Cl.
CPC ...... *H01S 5/02423* (2013.01); *H01S 5/02476* (2013.01); *H01S 5/4018* (2013.01); *H01S 5/4031* (2013.01)

(58) Field of Classification Search
CPC .......................... H01S 5/02423; H01S 5/02407
See application file for complete search history.

(56) References Cited

U.S. PATENT DOCUMENTS 9,003,848 B2    4/2015 Bammer et al.
9,559,491 B2    1/2017 Horn et al.
(Continued)

FOREIGN PATENT DOCUMENTS

AT    508356 A4    1/2011
DE    112005001445 T5    6/2007
(Continued)

*Primary Examiner* — Tuan N Nguyen
(74) *Attorney, Agent, or Firm* — Laurence A. Greenberg; Werner H. Stemer; Ralph E. Locher

(57) ABSTRACT

A diode laser arrangement for the cooling of and supply of electrical current to diode laser devices, having at least two stacks, each having a diode laser device which is configured to emit a laser beam, an upper cooling device, and a lower cooling device. The diode laser device is arranged on the upper cooling device and on the lower cooling device such that the diode laser device is arranged between the upper cooling device and the lower cooling device. The upper and lower cooling devices are in each case electrically connected to the diode laser device arranged therebetween. The upper cooling device and/or the lower cooling device of a stack are in each case formed as a microchannel cooler. The upper cooling device and/or the lower cooling device of a stack in each case have substantially no electrical insulation with respect to the diode laser device arranged therebetween.

17 Claims, 3 Drawing Sheets

(56) References Cited

U.S. PATENT DOCUMENTS

| | | | |
|---|---|---|---|
| 9,596,034 B2 | 3/2017 | Zimer et al. | |
| 2008/0056314 A1* | 3/2008 | Coleman | H01S 5/4031 372/36 |
| 2008/0095204 A1* | 4/2008 | Miyajima | H01S 5/024 257/E23.098 |
| 2014/0204968 A1 | 7/2014 | Liu | |

FOREIGN PATENT DOCUMENTS

| | | |
|---|---|---|
| DE | 102008026229 A1 | 12/2009 |
| DE | 102011009018 A1 | 8/2012 |
| DE | 102013216526 A1 | 2/2015 |
| DE | 112014004244 T5 | 9/2016 |
| EP | 0973237 A1 | 1/2000 |
| EP | 2324544 B1 | 1/2014 |

* cited by examiner

DIODE LASER ASSEMBLY AND DWM MODULE HAVING A DIODE LASER ASSEMBLY OF THIS TYPE

BACKGROUND OF THE INVENTION

Field of the Invention

The invention relates to a diode laser arrangement and a DWM module having a diode laser arrangement of said type.

During the operation of a diode laser arrangement with multiple diode laser devices, each of which has at least one emitter, for example a diode laser bar, heat losses are generated which must be dissipated in order to achieve a high output power with a simultaneously long service life, high beam quality, and intended and constant beam parameters. By cooling the diode laser devices in each case on both sides, in particular in each case on a p-side and an n-side of the emitters, the heat dissipation can in principle be increased. Typically, a diode laser arrangement formed in this way then has a plurality of stacks, each with two cooling devices, between which in each case one diode laser device is arranged.

In the case of such known diode laser arrangements, however, problems arise with regard to the supply of electrical current to the diode laser devices. For cooling the diode laser devices on both sides, electrically insulated cooling devices, which are referred to for example as ILASCO (isolated laser cooler), have hitherto usually been used. A respective supply of electrical current to the diode laser devices typically takes place here areally via busbars which, for example, are led out laterally from the stacks. These busbars then run, at least in certain sections, between the two cooling devices. A thickness of the busbars is therefore limited, at least in the region of the diode laser devices, to the thickness of the latter or to the height of a gap between the two cooling devices. Despite improved heat dissipation through double-sided cooling, an increase in the output power of the diode laser devices is therefore limited, since the current intensity can only be increased to a limited extent owing to the thickness limitation of the busbars.

SUMMARY OF THE INVENTION

The invention is based on the object of creating a diode laser arrangement and a DWM module with such a diode laser arrangement, wherein advantages are realized in relation to known diode laser arrangements and DWM modules with known diode laser arrangements, in particular with regard to a further increase in output power.

The object is achieved through the creation of the subjects of the independent claims. Advantageous refinements become apparent from the dependent claims.

The object is achieved in particular through the creation of a diode laser arrangement which has at least two stacks, each of which has a diode laser device, an upper cooling device and a lower cooling device. The diode laser arrangement is used in particular for the cooling of and for the supply of electrical current to diode laser devices, preferably in a DWM module. Such a DWM module is, in particular, a device for dense wavelength multiplexing, that is to say in particular for collimating several laser beams with different wavelengths into one composite or combined laser beam. A diode laser device of the type discussed is configured to emit a laser beam, which may also be composed of multiple partial laser beams. In the case of each of the at least two stacks, the diode laser device is arranged on the upper cooling device and on the lower cooling device such that the diode laser device is arranged between the upper cooling device and the lower cooling device. Preferably, the diode laser device lies in each case on the upper cooling device and on the lower cooling device. It is particularly preferable if the diode laser device, at an n-side, lies fully areally on the upper cooling device or the lower cooling device, and with a p-side, lies fully areally on the respective other cooling device. In the at least two stacks, the upper cooling device and the lower cooling device are in each case configured to cool the diode laser device arranged therebetween. Here, the upper cooling device and the lower cooling device in the at least two stacks are in each case electrically connected to the diode laser device arranged therebetween, in particular to at least one emitter of said diode laser device. In particular, in each case the upper cooling device of a stack is electrically connected to a p-side of the associated diode laser device and the lower cooling device of said stack is electrically connected to an n-side of the associated diode laser device, or vice versa.

Cooling devices of the type discussed are formed in particular as heat sinks. Here, upper cooling device or the lower cooling device of a stack of the type discussed, in particular the upper cooling device and the lower cooling device of such a stack, is/are in each case formed as a microchannel cooler. The upper cooling device or the lower cooling device of a stack of the type discussed, in particular the upper cooling device and the lower cooling device of such a stack, has/have in each case substantially no electrical insulation with respect to the diode laser device arranged therebetween.

The diode laser arrangement according to the invention has advantages in relation to the prior art. Owing to the fact that the upper cooling device and/or the lower cooling device of a stack is/are in each case formed as a microchannel cooler, and the upper cooling device and/or the lower cooling device of a stack have/has in each case substantially no electrical insulation with respect to the diode laser device arranged therebetween, a supply of higher electrical currents to the diode laser devices than in the case of known diode laser arrangements can be realized. In particular, the supply of electrical current can be implemented using thick volume bodies rather than via substantially thinner or flat busbars. Such solid bodies may be formed in particular as current bridges or current connection parts, which preferably have a larger cross section than flat busbars. Such solid bodies are in particular configured to conduct significantly higher electrical currents to the diode laser devices than is possible with known diode laser arrangements. It is furthermore possible to actively cool the solid bodies to be supplied with current, which makes particularly high current densities possible. Here, a reduction in heat transfer owing to insulating elements on or in the cooling devices can be avoided. Furthermore, a particularly compact design with relatively small dimensions can be realized. Overall, the output power of the diode laser arrangement, in particular of the diode laser devices, can be increased significantly.

The diode laser arrangement according to the invention thus has a total of at least two upper cooling devices which are arranged in an upper part of the diode laser arrangement. Analogously, the diode laser arrangement has at least two lower cooling devices which are arranged in a lower part, situated opposite the upper part, of the diode laser arrangement.

A diode laser device of the type discussed preferably has at least one, preferably multiple emitters, in particular individual emitters. In particular, the upper cooling device and the lower cooling device of a stack are in each case electrically connected to the at least one emitter. Such an emitter has, in particular, a laser-active material. It is preferably formed as an edge emitter. Such an emitter is preferably formed as a high-power emitter. The diode laser device particularly preferably has multiple emitters, wherein the diode laser device in particular has a diode laser bar with multiple emitters, which are preferably arranged in a one-dimensional row (array). For example, such a diode laser bar may have 23, 45 or any other number of emitters. Such a diode laser bar is preferably formed as a high-power diode laser bar. Such a high-power diode laser bar may for example have an output power of up to 1 kW or more.

In particular, several laser beams can be emitted by means of the diode laser arrangement according to the invention, wherein each of the diode laser devices emits in particular one laser beam, which may also be composed of several partial laser beams.

In one preferred embodiment of the diode laser arrangement, the emitters or diode laser bars respectively assigned to the diode laser devices each have different wavelengths or different wavelength spectra. Several different wavelengths or wavelength spectra can then thus be generated by means of several diode laser devices. Such an embodiment is advantageous for example when the diode laser arrangement according to the invention is used as a laser beam source in a DWM module for dense wavelength multiplexing, in which laser beams with in each case different wavelengths are collimated into one composite or combined laser beam.

In a further preferred embodiment of the diode laser arrangement, the at least one emitter or diode laser bar assigned to the diode laser devices has in each case the same wavelength or the same wavelength spectrum. For example, the output power of the diode laser arrangement can be scaled in this way by activation or deactivation of diode laser devices. Furthermore, by scaling the number of diode laser devices, a modular design of the diode laser arrangement is possible, as a result of which production costs can be reduced.

The upper cooling device and the lower cooling device are in each case electrically connected to the diode laser device arranged therebetween, such that electrical current can be supplied to said diode laser device. In particular, the upper cooling device is electrically connected to an n-side of the diode laser device or of the associated at least one emitter, and the lower cooling device is electrically connected to a p-side of the diode laser device or of the associated at least one emitter, or alternatively the upper cooling device is electrically connected to the p-side and the lower cooling device is electrically connected to the n-side. In particular, for the supply of electrical current to the diode laser device, the cooling devices have electrically conductive material or are composed of electrically conductive material. Such an electrically conductive material is preferably copper or a copper alloy.

It is in particular possible for a diode laser device to have one or two submounts which is/are arranged on a p-side or an n-side of the corresponding at least one emitter. A submount of the type discussed may be formed as a heat spreader, wherein waste heat from the at least one emitter can be conducted particularly effectively in the direction of the upper cooling device and/or of the lower cooling device. Furthermore, different coefficients of thermal expansion of the at least one emitter and of the upper and lower cooling device respectively can be compensated for by means of such a submount. A submount of the type discussed is in particular of electrically conductive form, such that an electrical connection between the at least one emitter and the upper cooling device and the lower cooling device respectively can be realized. In particular, the at least one emitter of the respectively assigned diode laser device and optionally assigned submounts can be cooled by means of the cooling devices. Where an electrical or thermal connection between the at least one emitter and a cooling device is mentioned below, this also includes such a connection via a submount arranged therebetween.

A microchannel cooler of the type discussed is also referred to as MCC. Such a microchannel cooler is preferably formed as a liquid-type cooler with very fine cooling fluid channels which are situated close to a heat source, that is to say in particular close to the diode laser device, and through which cooling fluid flows. Such cooling fluid channels are formed for example as bores, recesses and/or passages. Particularly effective cooling of the diode laser device can be effected by means of a microchannel cooler, wherein, in particular, a direct heat transfer from the diode laser device to the microchannel coolers respectively arranged thereon is possible.

In particular, the cooling fluid channels or their walls, and/or a region of the respective cooling device arranged on or lying against the diode laser device, have substantially no electrical insulation. In the case of microchannel coolers configured in this way, sufficient dimensioning of electrical-current-carrying parts, for example with regard to a cross section, can be realized in a manner dependent on a required electrical current, with effective cooling being ensured at the same time. It is particularly preferable if the upper cooling device and/or the lower cooling device of a stack in each case have/has no electrical insulation with respect to the diode laser device arranged therebetween. For example, a corresponding microchannel cooler is composed of electrically and thermally highly conductive material, such that its electrical and thermal conductivity are preferably optimized.

In particular, the upper cooling device and/or the lower cooling device of a stack have/has substantially no or absolutely no electrical insulation of cooling parts and electrical-current-carrying parts with respect to the diode laser device arranged therebetween. In this way, in particular fully areal electrical contacting of the diode laser device can be realized by means of the upper cooling device and/or the lower cooling device. In particular, electrical-current-carrying parts of the cooling devices can be designed to be particularly thick or have a large cross section in order to be able to conduct high electrical currents. Overall, in the case of the diode laser arrangement according to the invention, a thick configuration of electrical-current-carrying parts of the cooling devices in a manner dependent on a required current does not prevent effective cooling, because in particular electrical-current-carrying parts and cooling parts are of designed to be integrated.

An embodiment of the diode laser arrangement is preferable which is distinguished by the fact that the diode laser devices of the at least two stacks are arranged laterally adjacent to one another. An arrangement of the diode laser devices of the at least two stacks laterally adjacent to one another specifies in particular that the diode laser devices are not arranged one above the other.

In particular, it is rather the case that vectors which each point from a p-side to an n-side in the individual diode laser devices lie parallel to and spaced apart from one another. In particular, a lateral extent of the diode laser devices extends in each case in the direction of adjacent diode laser devices. Such a direction will hereinafter be referred to in particular as a horizontal direction. In this respect, the diode laser arrangement can also be referred to as a horizontal or lateral arrangement of stacks or diode laser devices. Accordingly, a vertical direction is, in particular, a direction which runs in the direction of a connecting vector between an n-side and a p-side of a diode laser device. This enables the diode laser devices to be connected in series in a simple manner.

An embodiment of the diode laser arrangement is preferable which is distinguished by the fact that the diode laser devices of the at least two stacks are electrically connected in series. In particular, the diode laser devices of the at least two stacks are electrically connected in series in the forward direction. In particular, the same current flows through all diode laser devices. This is advantageous because, in this way, no deviations in the current distribution between the individual diode laser devices can occur. It is possible for a plurality of emitters to be connected electrically in parallel or in series within a diode laser device. A supply of electrical current to the diode laser arrangement is thus required only at a first and a final diode laser device of the diode laser arrangement, or a first and a final emitter. Warming, for example in electrical-current-carrying lines, can thus be reduced in comparison with a parallel connection, in particular owing to a lower current.

An embodiment of the diode laser arrangement is preferable which is distinguished by the fact that the diode laser devices, in particular the respectively assigned at least one emitter, of the at least two stacks are in each case arranged with alternating orientation with regard to a p-side and an n-side. The p-side is thus in particular arranged alternately on the upper cooling device and the lower cooling device, wherein the n-side is arranged alternately correspondingly on the respective other cooling device. In particular, the p-side and the n-side of a plurality of emitters of a diode laser device are oriented in the same way, wherein they are in particular arranged either on the upper cooling device or the lower cooling device and electrically connected thereto. Such an alternating orientation is particularly advantageous, because a simple and particularly compact construction of the diode laser arrangement can be realized in this way. The alternating orientation of the emitters is also advantageous because current bridges of the type described further below can be arranged in straight or linear fashion on in each case one side of the stack, that is to say either in the upper part or the lower part of the diode laser arrangement. Otherwise, it would for example be necessary for an electrical connection between a top side of a stack and a bottom side of an adjacent stack to be realized in order to allow a series connection. Here and in the following, a top side refers to a side which in particular points toward the upper part of the diode laser arrangement, wherein a bottom side constitutes a side which points in particular toward the lower part of the diode laser arrangement.

An embodiment of the diode laser arrangement is preferable which is distinguished by the fact that in each case two adjacent stacks of the type discussed are arranged spaced apart from one another. In particular, two adjacent stacks do not make contact with one another. A short circuit between adjacent stacks can thus be avoided in a simple manner.

An embodiment of the diode laser arrangement is preferable which is distinguished by the fact that in each case one cooling fluid can be conducted through the upper cooling device or the lower cooling device, in particular the upper cooling device and the lower cooling device, which fluid is in each case not electrically insulated with respect to an electrical-current-carrying part of the upper cooling device and/or of the lower cooling device at least in certain sections. In particular, a fluid that can be conducted through the upper cooling device is not insulated with respect to an electrical-current-carrying part of the upper cooling device at least in sections. Analogously, a fluid that can be conducted through the lower cooling device is preferably not electrically insulated with respect to an electrical-current-carrying part of the lower cooling device at least in sections.

The electrical-current-carrying part of the upper cooling device is in particular a part of the upper cooling device which is electrically connected to the diode laser device, wherein the electrical-current-carrying part of the lower cooling device is analogously a part of said lower cooling device which is electrically connected to the diode laser device. It is possible that the entire upper cooling device and/or lower cooling device, in particular the microchannel cooler(s), carry/carries electrical current. This results in greater freedom with regard to the geometric and material design of the cooling devices, in particular the supply of electrical current and the corresponding cooling fluid channels.

An embodiment of the diode laser arrangement is preferable which is distinguished by the fact that a cooling fluid has deionized water or is composed of deionized water. Deionization can be carried out, for example, by means of a filter system familiar to the person skilled in the art. Depending on the degree of deionization, the cooling fluid has very little or even no electrical conductivity. This reliably prevents the possibility of an unintended electrical connection of multiple cooling devices to one another via the cooling fluid. A short circuit or electrical bridging of individual or several diode laser devices can thus be reliably avoided. In addition, it is possible to avoid electrical corrosion in the cooling fluid channels or other cooling-fluid-carrying components of the diode laser arrangement.

An embodiment of the diode laser arrangement is preferable which is distinguished by the fact that the diode laser arrangement has at least one upper current bridge or at least one lower current bridge, in particular at least one upper current bridge and one lower current bridge, which are/is in each case configured to conduct electrical current. In particular, in each case two mutually adjacently arranged upper cooling devices are arranged on such an upper current bridge and are electrically connected to one another via said upper current bridge. In particular, alternatively or in addition, two mutually adjacently arranged lower cooling devices are arranged on such an lower current bridge and are electrically connected to one another via said lower current bridge.

In particular, the at least one upper current bridge and/or the at least one lower current bridge have/has electrically conductive material or are/is composed of electrically conductive material. In particular, the at least one upper current bridge and/or the at least one lower current bridge are/is of electrically conductive form in particular in a region which is configured for electrically connecting two mutually adjacently arranged upper cooling devices and/or lower cooling devices.

An arrangement of cooling devices adjacent to one another specifies in particular an arrangement of horizontally directly adjacent cooling devices, wherein these are arranged either in the upper part or in the lower part of the diode laser arrangement. The at least one upper current bridge and/or the at least one lower current bridge are/is preferably basically not limited with regard to their dimensioning, in particular their thickness or their cross section, wherein they/it may be designed in a manner dependent a maximum required current. In particular, a thickness of the current bridges is not limited by the height of a gap between two cooling devices of a stack, or a thickness of the corresponding diode laser device, as is the case for example with busbars in insulated cooling devices (ILASCO), at least in the region of the diode laser devices. Also, the current does not need to be conducted away from the diode laser device laterally or to the rear, that is to say in a direction averted from the emitted laser beam, for example via thin metal sheets.

The at least one upper current bridge and/or the at least one lower current bridge preferably have/has a material, or are composed of a material, which is selected from a group comprising copper and a copper alloy. The upper current bridge and/or the lower current bridge may have a coating, wherein said coating preferably has gold, a gold alloy, silver or a silver alloy. Such materials are particularly suitable in particular owing to their electrical and thermal conductivity. Current bridges of the type discussed can, in particular in the case of an alternating orientation of the diode laser devices, be of substantially linear or bar-shaped design, as a result of which they can be manufactured particularly easily and inexpensively.

A diode laser device is preferable which is distinguished by the fact that the diode laser arrangement has a first current connection part and a second current connection part which are in each case configured to conduct electrical current, wherein the first current connection part is arranged on the upper cooling device or the lower cooling device of a first stack of the at least two stacks and is electrically connected thereto, and wherein the second current connection part is arranged on the upper cooling device or the lower cooling device of a final stack of the at least two stacks and is electrically connected thereto.

In particular, the first stack is that stack which is arranged at a first end of the horizontally concatenated stacks. The final stack is in particular that stack which is arranged at a second end, situated opposite the first end, of the horizontally concatenated stacks. The first stack and the final stack thus in particular form in each case one end of the horizontal concatenation of the stacks of the diode laser arrangement.

The first current connection part and the second current connection have in particular in each case one current connection which can be connected to an electrical current source. The diode laser devices can be supplied with electrical current by means of such an electrical current source. In particular, an electrical current flows from such a current connection via the first or second current connection part respectively and via a cooling device of the first or final stack to the n-side or the p-side of the diode laser device of said stack. In particular, the electrical current flows from the respective other side of said diode laser device via the other cooling device of said stack and via a current bridge to the adjacent stack, wherein the current flows via a cooling device of said stack to the corresponding diode laser device, and so on.

Between the first and the final stack, the current flows in particular via the current bridges of the type discussed. In particular, it is possible to conduct a current with an intensity of up to 1000 A or more to the diode laser devices. In particular, the first current connection part and the second current connection part have an electrically conductive material, for example copper or a copper alloy, at least in an electrical-current-carrying region.

If, for example, an upper current bridge is arranged on and electrically connected to the upper cooling device of the first stack, then the first current connection part is arranged on and electrically connected to the lower cooling device of the first stack. By contrast, if the first current connection part is arranged on and electrically connected to the upper cooling device of the first stack, then a lower current bridge is arranged on and electrically connected to the lower cooling device of the first stack. Analogously, the second current connection part is arranged on the final stack in the upper or lower part.

In particular, the first current connection part and/or the second current connection part are/is configured analogously to the at least one upper current bridge and/or the at least one lower current bridge with regard to a material and/or dimensioning, in particular a cross section. Such current connection parts can be of substantially linear or bar-shaped design, such that they can be produced particularly easily and inexpensively.

An embodiment of the diode laser arrangement is preferable which is distinguished by the fact that at least one component of the diode laser arrangement selected from a group comprising the at least one upper current bridge, the at least one lower current bridge, the first current connection part and the second current connection part is in each case formed so as to be capable of being flowed through by a cooling fluid. Here, it is preferable if at least one component selected from the group comprising the at least one upper current bridge, the at least one lower current bridge, the first current connection part and the second current connection part is coolable in each case by means of the cooling fluid. For this purpose, the current bridges or the current connection parts preferably have suitable cooling fluid channels for conducting cooling fluid, for example bores, recesses and/or passages. Here, in each case one or more feed channels and/or discharge channels may be provided, by means of which the respectively assigned cooling devices can be supplied with cooling fluid. In this way, the cooling devices can be supplied with cooling fluid easily. Cooling of the current bridges or current connection parts can advantageously assist a cooling action of the cooling devices, in particular in the event of intense warming of the diode laser devices.

An embodiment of the diode laser arrangement is preferable which is distinguished by the fact that the diode laser arrangement has an upper cooling fluid distributor or a lower cooling fluid distributor, or alternatively an upper cooling fluid distributor and a lower cooling fluid distributor, which are/is in each case configured for conducting a cooling fluid. It is preferable here if the at least two upper cooling devices are in each case fluidically connected, particularly preferably via an upper current bridge and/or the first current connection part and/or the second current connection part, to the upper cooling fluid distributor. Alternatively or in addition, it is preferable if the at least two lower cooling devices are in each case fluidically connected, preferably via a lower current bridge and/or the first current connection part and/or the second current connection part, to the lower cooling fluid distributor. The upper cooling fluid distributor is preferably arranged in the upper part of the diode laser arrangement and the lower cooling fluid distributor is preferably arranged in the lower part of the diode laser arrangement. However, it is also possible for a or the cooling distributors to be arranged at a different location on the diode laser arrangement.

In particular, the upper cooling fluid distributor and/or the lower cooling fluid distributor in each case have/has cooling fluid channels which are fluidically connected to cooling fluid channels of the at least one upper current bridge, of the at least one lower current bridge, of the first current connection part and/or of the second current connection part and also of the at least one upper cooling device and/or of the at least one lower cooling device. For example, an upper cooling fluid circuit for supplying cooling fluid to the upper cooling devices and/or a lower cooling fluid circuit for supplying cooling fluid to the lower cooling devices are/is realized. Both cooling fluid circuits may be fluidically coupled to one another or separate from one another. The cooling fluid channels of the upper cooling fluid distributor and/or of the lower cooling fluid distributor may be formed for example as bores, recesses and/or passages.

The upper cooling fluid distributor and/or the lower cooling fluid distributor may in each case have a plurality of cooling fluid channels which are geometrically separate from one another at least in certain sections and which are formed for example respectively as inlet channels for supplying cooling fluid and as outlet channels for discharging cooling fluid to/from the cooling devices.

It is possible that the diode laser arrangement has only one such cooling fluid distributor, which is arranged in the upper part or the lower part or at another location on the diode laser arrangement and which is fluidically connected to the upper cooling devices and/or the lower cooling devices. By means of the upper and/or the lower cooling fluid distributor, it is possible for cooling fluid to be distributed in a simple and space-saving manner.

An embodiment of the diode laser arrangement is preferable which is distinguished by the fact that the upper cooling fluid distributor are/is formed so as to be electrically insulated in each case with respect to at least one component selected from a group comprising the at least one upper current bridge, the first current connection part and the second current connection part. Alternatively or in addition, the lower cooling fluid distributor are/is preferably formed so as to be electrically insulated in each case with respect to a component selected from a group comprising the at least one lower current bridge, the first current connection part and the second current connection part. Such electrical insulation may be implemented for example by means of a spacing or a layer composed of an electrically insulating material between a cooling fluid distributor of the type discussed and a current bridge or a current connection part of the type discussed.

In particular, the first current connection part is electrically insulated with respect to the upper cooling fluid distributor if said first current connection part is arranged in the upper part of the diode laser arrangement. By contrast, the first current connection part is in particular electrically insulated with respect to the lower cooling fluid distributor if said first current connection part is arranged in the lower part of the diode laser arrangement. Analogously, the second current connection part is in particular formed so as to be electrically insulated with respect to the upper or the lower cooling fluid distributor.

The upper cooling fluid distributor is in particular formed so as to be electrically insulated with respect to the upper cooling devices, wherein the lower cooling fluid distributor is in particular formed so as to be electrically insulated with respect to the lower cooling devices.

The upper cooling fluid distributor and/or the lower cooling fluid distributor preferably have/has an electrically insulating material, or are/is composed of an electrically insulating material, in particular in regions at which the upper and/or the lower cooling fluid distributor is arranged or lies on a current bridge, a current connection part or a cooling device. In this way, an unintended current flow or a short circuit, for example between adjacent upper current bridges and/or lower current bridges, is reliably avoided.

An embodiment of the diode laser arrangement is preferable which is distinguished by the fact that at least one component selected from a group comprising the at least one upper current bridge, the first current connection part and the second current connection part is arranged on the upper cooling fluid distributor, preferably in each case in a recess of the upper cooling fluid distributor. Alternatively or in addition, it is preferable if at least one component selected from a group comprising the at least one lower current bridge, the first current connection part and the second current connection part is arranged on the lower cooling fluid distributor, preferably in each case in a recess of the lower cooling fluid distributor.

Whether the first current connection part and/or the second current connection part are arranged in a recess of the upper or of the lower cooling fluid distributor depends in particular on the arrangement of the first or second current connection respectively in the upper or the lower part of the diode laser arrangement. A particularly compact configuration of the diode laser arrangement can be realized by means of the recesses.

An embodiment of the diode laser arrangement is preferable which is distinguished by the fact that the at least one upper current bridge or the at least one lower current bridge, or alternatively the at least one upper current bridge and the at least one lower current bridge, are/is in each case of stepped form, such that a height offset of the emitted laser beams owing to the alternating orientation of the diode laser devices is compensated.

Such a height offset arises for example if the diode laser devices are in each case arranged with alternating orientation with regard to their p-side and n-side, wherein, in each case, an emission of the laser beams takes place non-centrally with respect to a vertical extent of the diode laser device, in particular of the at least one emitter. For example, in the case of edge emitters, the laser beam is typically emitted at the break edge thereof close to the surface of the p-side, transversely with respect to the electrical current.

In particular, a stepped configuration of the at least one upper current bridge on a contact surface on which in each case two upper cooling devices are arranged is formed such that said two upper cooling devices are vertically offset with respect to one another. In particular, a stepped configuration of the at least one lower current bridge on a contact surface on which in each case two lower cooling devices are arranged is formed such that said two lower cooling devices are vertically offset with respect to one another. In particular, such a vertical offset of the cooling devices causes a vertical offset of the diode laser devices respectively assigned to the cooling devices, in particular of the emitters.

A stepped configuration of the upper current bridge and of the lower current bridge are preferably, in particular if the diode laser devices are in each case arranged with alternating orientation, coordinated with one another such that the stacks or the diode laser devices are arranged so as to be offset vertically alternately in one direction and in the other direction. As an alternative or in addition to such a stepped configuration, an offset arrangement of the stacks or of the diode laser devices may be realized by means of submounts arranged alternately on a top side or a bottom side of a diode laser device, or also with submounts of varying thickness. An offset of this type may, depending on the construction of the at least one emitter, be for example approximately 0.1 mm. In this way, the diode laser devices, in particular the respective emitters, can in each case be arranged relative to one another such that a height offset of the emitted laser beams is compensated. Compensating for such a height offset is advantageous for example if the various laser beams are collimated into one composite or combined laser beam, for example in a DWM module for dense wavelength multiplexing.

The object is in particular also achieved through the creation of a DWM module for dense wavelength multiplexing for generating a coupled-out laser beam. The DWM module has a diode laser arrangement according to one of the embodiments described above. In particular, the advantages that have already been discussed in conjunction with the diode laser arrangement are obtained in conjunction with the DWM module. In the case of the DWM module, in particular, the production costs thereof are not significantly higher in relation to known technologies, although its output power can be significantly increased by means of the diode laser arrangement.

The DWM module preferably has a cooling unit for the cooling and treatment of cooling fluid, which cooling unit is configured to supply cooling fluid to the diode laser arrangement and in particular to cool the diode laser devices.

The DWM module preferably has an energy supply device which is configured to in particular supply electrical current to the diode laser arrangement and the cooling unit.

The DWM module preferably has an driving device which is configured to drive, in particular control in open-loop or closed-loop fashion, in particular the energy supply device and the cooling unit. It is possible for the diode laser arrangement to have sensors, for example for closed-loop temperature control or for closed-loop power control of the diode laser devices.

The DWM module preferably has a beamforming device which is configured to collimate the laser beams emitted by means of the diode laser devices into one common laser beam and to couple them out. Such a coupled-out laser beam is in particular combined from or composed of multiple partial laser beams. In particular, it has approximately the properties of a laser beam from a single emitter. In particular, corresponding optical devices are provided for this purpose.

The invention will be discussed in more detail below on the basis of the drawing.

DETAILED DESCRIPTION OF THE INVENTION

Figure 1:
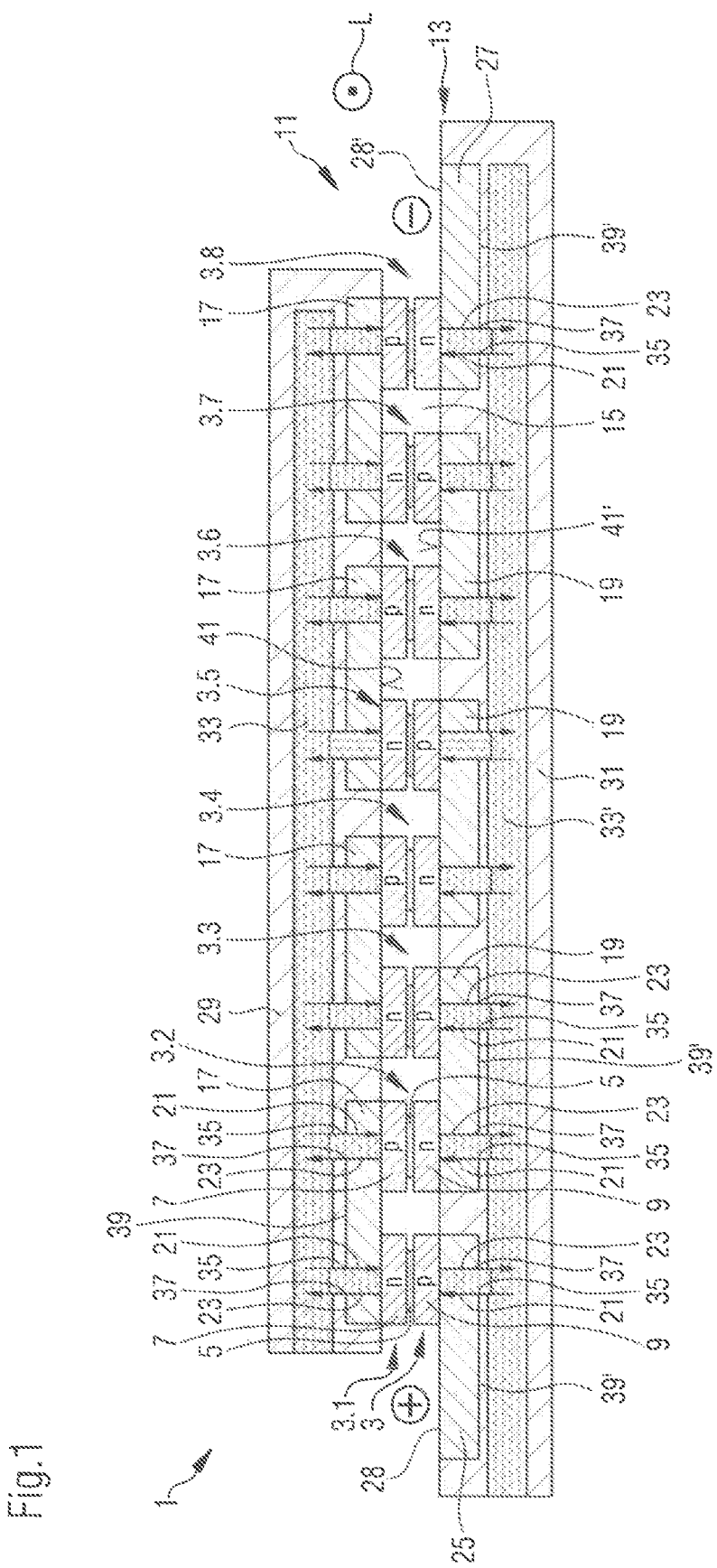
FIG. 1 is a schematic illustration of a first exemplary embodiment of a diode laser arrangement in cross section.

FIG. 1 schematically illustrates a first exemplary embodiment of a diode laser arrangement 1 in cross section. The diode laser arrangement 1 is used for example for the cooling of and for the supply of electrical current to diode laser devices, in particular in a DWM module. The diode laser arrangement 1 has at least two stacks 3. In the embodiment shown in FIG. 1, the diode laser arrangement 1 has eight stacks 3, specifically the stacks 3.1, 3.2, 3.3, 3.4, 3.5, 3.6, 3.7 and 3.8. The stacks 3 are arranged along a horizontal direction. In the following, a direction which—lying in an image plane—runs perpendicular to the horizontal direction is referred to as the vertical direction.

The stacks 3 have in each case one diode laser device 5, wherein, for the sake of clarity, a corresponding reference designation is plotted only at the first stack 3.1 and the second stack 3.2. The diode laser devices 5 are in each case configured to emit a laser beam. In particular, the diode laser arrangement 1 is configured to emit eight laser beams by means of the eight diode laser devices 5. The laser beams are in this case emitted substantially out of the image plane, as it were in the direction of a viewer. A symbol which indicates such a laser beam emission direction is denoted schematically by the reference designation L.

The diode laser devices 5 have in each case at least one emitter, in particular with a laser-active material. The diode laser devices 5 preferably have in each case a plurality of emitters, particularly preferably a diode laser bar, in particular a high-power diode laser bar.

The stacks 3 have in each case an upper cooling device 7. Furthermore, the stacks 3 have in each case a lower cooling device 9. For the sake of clarity, the upper cooling device 7 and the lower cooling device 9 are in each case denoted by a reference designation only in the case of the first stack 3.1 and the second stack 3.2.

The diode laser devices 5 optionally have in each case one or two submounts, which are in each case arranged in particular between the at least one emitter and the upper cooling device 7 and/or the lower cooling device 9. Submounts 57 are illustrated by way of example in FIG. 4.

The upper cooling devices 7 are—from the viewer's perspective—arranged in an upper part 11 of the diode laser arrangement 1. The lower cooling devices 7 are—from the viewer's perspective—arranged in a lower part 13, arranged opposite the upper part 11, of the diode laser arrangement 1. The diode laser devices 5 are thus arranged, as it were, between the upper part 11 and the lower part 13.

The diode laser device 5 of the first stack 3.1, in particular the at least one emitter thereof, has for example an n-side which is arranged on or lies against the upper cooling device 7, optionally via a submount 57. Furthermore, the diode laser device 5 of the first stack 3.1, in particular the at least one emitter thereof, has for example an p-side which is arranged on or lies against the lower cooling device 9, optionally via a further submount 57. The n-side and the p-side are in each case denoted by the reference designations n and p respectively. The n-side and the p-side of the diode laser device 5 of the second stack 3.2 are arranged in a reversed manner in relation to the first stack 3.1. In the second stack 3.2, the p-side is arranged on the upper cooling device 7 and the n-side is arranged on the lower cooling device 9.

In the case of each of the stacks 3, the diode laser device 5 is arranged on the upper cooling device 7 and on the lower cooling device 9 such that the diode laser device 5 is arranged between the upper cooling device 7 and the lower cooling device 9, as it were in a sandwich-like manner.

In the stacks 3, the upper cooling device 7 and the lower cooling device 9 are in each case configured to cool the diode laser device 5 arranged therebetween. Optionally, the upper cooling device 7 and the lower cooling device 9 are in each case configured to conduct cooling fluid in order to cool the diode laser device 5. Optionally provided submounts 57 give rise in particular to improved heat transfer between the in each case at least one emitter and the cooling devices 7, 9.

Furthermore, the upper cooling device 7 and the lower cooling device 9 in the stacks 3 are in each case electrically connected to the diode laser device 5 arranged therebetween, in particular to the at least one emitter. For example, in the first stack 3.1, the n-side of the at least one emitter is electrically connected to the upper cooling device 7, wherein the p-side of said at least one emitter is electrically connected to the lower cooling device 9.

In particular, at least contact surfaces of the diode laser device 5 and of the upper cooling device 7 and of the lower cooling device 9 are configured to be electrically conductive, such that an electrical connection is realized via these. In particular, a diode laser device 5 lies against the associated upper cooling device 7 or lower cooling device 9 via such contact surfaces. Contact is preferably provided in each case between the diode laser device 5 and the cooling devices 7, 9 over a large area or a full area, such that large electrical currents can be transmitted.

Figure 2:
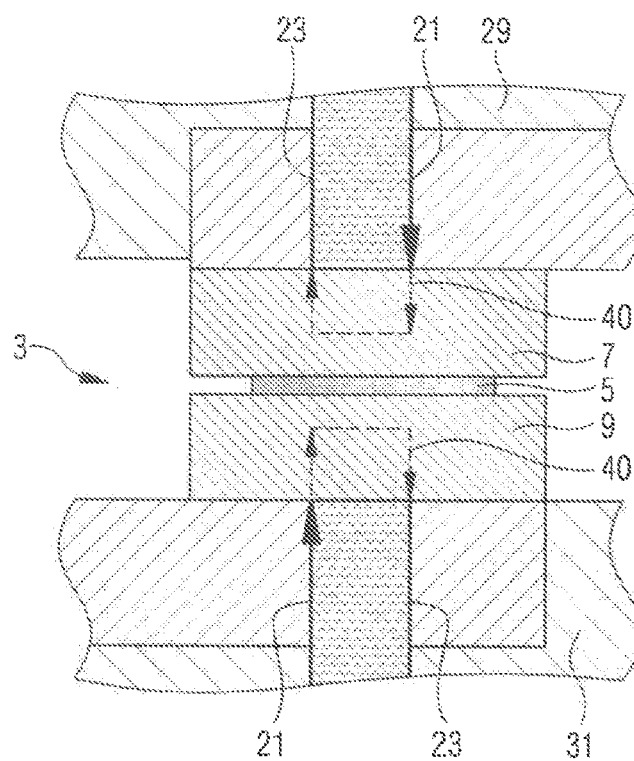
FIG. 2 is a schematic illustration of a detail of the diode laser arrangement as per FIG. 1.

The upper cooling device 7 and/or the lower cooling device 9 of a stack 3 are/is in each case formed as a microchannel cooler. Here, the upper cooling device 7 and the lower cooling device 9 optionally each have/has suitable cooling fluid channels, which are formed for example as bores, recesses and/or passages for conducting cooling fluid. Features of such a configuration, for example of a cooling channel structure, are not shown in FIG. 1 for the sake of clarity. Such a microchannel cooler is schematically illustrated in FIG. 2, which will be described further below.

The upper cooling device 7 and/or the lower cooling device 9 of a stack 3 in each case have/has substantially no electrical insulation with respect to the diode laser device 5 arranged therebetween. In particular, cooling parts of the cooling devices 7, 9, for example regions with cooling fluid channels, are substantially not electrically insulated with respect to the diode laser device 5. In particular, the cooling devices 7 and/or 9 are formed such that electrical-current-carrying parts, also in the region of cooling parts, are formed throughout with dimensioning, for example a cross section, adapted to a maximum required current.

The diode laser devices 5 of the stacks 3 are optionally—as illustrated in FIG. 1—arranged laterally adjacent to one another. Here, the diode laser devices 5 are arranged along a horizontal extent of the diode laser arrangement 1, wherein a connecting vector between the n-side and the p-side of a diode laser device 5 runs perpendicular to the horizontal extent, in particular along a vertical extent of the diode laser arrangement 1.

Optionally, the diode laser devices 5 of the stacks 3, in particular the emitters thereof, are electrically connected in series. Such a configuration is illustrated in FIG. 1.

Optionally, the diode laser devices 5 of the stacks 3 are in each case arranged with alternating orientation with regard to the p-side and the n-side, as illustrated in FIG. 1. The upper cooling devices 7 and the lower cooling devices 9 are in this case arranged alternately on a p-side and an n-side of the diode laser devices 5, in particular are in each case electrically connected to the p-sides and n-sides respectively.

Optionally, in each case two adjacent stacks 3, for example the first stack 3.1 and the second stack 3.2, or the second stack 3.2 and the third stack 3.3, are arranged spaced apart from one another. As per FIG. 1, all stacks 3 are arranged spaced apart from one another. In particular, in each case one separation region 15 is arranged between the stacks 3, wherein, for the sake of clarity, only one separation region 15 between the seventh stack 3.7 and the eighth stack 3.8 is denoted by a reference designation. In particular, unintended electrical connections between the stacks 3 are thus avoided.

Optionally, in each case one cooling fluid can be conducted through the upper cooling device 7 and/or the lower cooling device 9, which fluid is in each case not electrically insulated with respect to an electrical-current-carrying part of the upper cooling device 7 and/or of the lower cooling device 9 at least in certain sections. In particular, no electrical insulation is provided at least in certain sections between the cooling fluid and the diode laser device 5, in particular a p-side or an n-side.

Optionally, a cooling fluid has deionized water or is composed of deionized water. In particular, the water is deionized to such an extent that its electrical conductivity is very low or is even zero.

The diode laser arrangement 1 optionally has at least one upper current bridge 17 and/or at least one lower current bridge 19, which are/is in each case configured to conduct electrical current. Here, in each case two mutually adjacently arranged upper cooling devices 7 are arranged on an upper current bridge 17 and are electrically connected to one another via said upper current bridge. Optionally, alternatively or in addition, two mutually adjacently arranged lower cooling devices 9 are arranged on an lower current bridge 19 and are electrically connected to one another via said lower current bridge. In the exemplary embodiment as per FIG. 1, the diode laser arrangement 1 has four upper current bridges 17 and three lower current bridges 19. The four upper current bridges 17 are arranged in the upper part 11 of the diode laser arrangement 1, wherein the three lower current bridges 19 are arranged in the lower part 13. In particular, the upper current bridges 17 and the lower current bridges 19 are in each case electrically connected to electrical-current-carrying parts of the upper cooling devices 7 and lower cooling devices 9 respectively arranged thereon. In the case of the diode laser arrangement 1 as per FIG. 1, the positions of the upper current bridges 17 are offset laterally or horizontally in relation to the positions of the lower current bridge 19 in each case by one stack 3.

Here, the upper current bridges 17 and the lower current bridges 19 have in each case inlet channels 21 via which cooling fluid can be supplied to the respectively assigned upper cooling devices 7 and lower cooling devices 9. Here, the upper current bridges 17 and the lower current bridges 19 have in each case outlet channels 23 via which cooling fluid can be received from the respectively assigned upper cooling devices 7 and lower cooling devices 9. For the sake of clarity, the inlet channels 21 and the outlet channels 23 are denoted by reference designations only in the case of the upper current bridge 17 assigned to the first stack 3.1 and to the second stack 3.2 and in the case of the lower current bridge 19 assigned to the second stack 3.2 and to the third stack 3.3. For the sake of clarity, cooling fluid channels, which are fluidically connected to the inlet channels 21 and to the outlet channels 23, in the upper cooling devices 7 and the lower cooling devices 9 respectively are not illustrated here.

Optionally, the diode laser arrangement 1 has a first current connection part 25 and a second current connection part 27, which are in each case configured to conduct electrical current. Here, the first current connection part 25 is arranged on the lower cooling device 9 of the first stack 3.1 and is electrically connected thereto. In an alternative exemplary embodiment which is not illustrated here, the first current connection part 25 may also be arranged on the upper cooling device 7 of the first stack 3.1. Here, the second current connection part 27 is arranged on the lower cooling device 9 of the final stack, that is to say of the eighth stack 3.8, and is electrically connected thereto. In an alternative exemplary embodiment which is not illustrated here, the second current connection part 27 may also be arranged on the upper cooling device 7 of the final stack.

In particular, the first current connection part 25 and the second current connection part 27 are in each case electrically connected to electrical-current-carrying parts of the upper cooling devices 7 and lower cooling devices 9 respectively arranged thereon, in this case only to electrical-current-carrying parts of the lower cooling devices 9 respectively arranged thereon.

Here, the first current connection part 25 and the second current connection part 27 have in each case inlet channels 21 via which cooling fluid can be supplied to the respectively assigned lower cooling devices 9. Here, the first current connection part 25 and the second current connection part 27 furthermore have outlet channels 23 via which cooling fluid can be received from the respectively assigned lower cooling devices 9. For the sake of clarity, cooling fluid channels, which are fluidically connected to the inlet channels 21 and to the outlet channels 23, in the lower cooling devices 9 are not illustrated here.

As per FIG. 1, the first current connection part 25 and the second current connection part 27 are arranged in the lower part 13 of the diode laser arrangement 1.

As per FIG. 1, the first current connection part 25 has a first current connection 28 which, by way of example, is a positive terminal. Here, the second current connection part 27 has a second current connection 28' which, by way of example, is a negative terminal.

Optionally, the at least one upper current bridge 17 and/or the at least one lower current bridge 19 and/or the first current connection part 25 and/or the second current connection part 27 are/is in each case formed so as to be capable of being flowed through by a cooling fluid, wherein, preferably, the at least one upper current bridge 17 and/or the at least one lower current bridge 19 and/or the first current connection part 25 and/or the second current connection part 27 is coolable in each case by means of the cooling fluid. In the exemplary embodiment as per FIG. 1, the upper current bridges 17, the lower current bridges 19, the first current connection part 25 and the second current connection part 27 are in each case formed so as to be capable of being flowed through by a cooling fluid. Here, in particular, the upper current bridges 17, the lower current bridges 19, the first current connection part 25 and the second current connection part 27 are in each case coolable by means of the cooling fluid.

Optionally, the diode laser arrangement 1 has an upper cooling fluid distributor 29 and/or a lower cooling fluid distributor 31, which are/is in each case configured for conducting cooling fluid. Optionally, here, the at least two upper cooling devices 7 are in each case fluidically connected, preferably via an upper current bridge 17, the first current connection part 25 and/or the second current connection part 27, to the upper cooling fluid distributor 29. Optionally, alternatively or in addition, the at least two lower cooling devices 9 are in each case fluidically connected, preferably via a lower current bridge 19, the first current connection part 25 and/or the second current connection part 27, to the lower cooling fluid distributor 31.

As per FIG. 1, an upper cooling fluid distributor 29, which is arranged in the upper part 11, and a lower cooling fluid distributor 31, which is arranged in the lower part 13, are provided. The cooling fluid distributors 29, 31 are in each case configured for conducting cooling fluid. The upper cooling devices 7 are in each case fluidically connected, here via the upper current bridges 17, to the upper cooling fluid distributor 29, wherein the lower cooling devices 9 are in each case fluidically connected, here via the first current connection part 25, the lower current bridges 19 and the second current connection part 27, to the lower cooling fluid distributor 31.

The upper cooling fluid distributor 29 and the lower cooling fluid distributor 31 have in each case a cooling fluid supply channel 33, 33'. The cooling fluid supply channel 33, 33' is illustrated schematically here. It may for example have an inlet channel which supplies cooling fluid to the inlet channels 21, wherein it may have an outlet channel which receives cooling fluid from the outlet channels 23. Optionally, the diode laser arrangement 1 has an upper cooling fluid circuit in the upper part 11 and a lower cooling fluid circuit in the lower part 13. The upper and the lower cooling fluid circuit may be fluidically separate or fluidically coupled to one another.

As per FIG. 1, upper current bridges 17 and the lower current bridges 19 in each case have two inlet connections 35, via which the upper cooling fluid distributor 29 and the lower cooling fluid distributor 31 respectively, in particular in each case the associated cooling fluid supply channel 33, 33', is fluidically connected in each case to the upper current bridges 17 and the lower current bridges 19 respectively, in particular to the inlet channels 21 situated therein. Furthermore, here, the upper current bridges 17 and the lower current bridge 19 in each case have two outlet connections 37, via which the upper cooling fluid distributor 29 and the lower cooling fluid distributor 31 respectively, in particular in each case the associated cooling fluid supply channel 33, is fluidically connected in each case to the upper current bridges 17 and the lower current bridge 19 respectively, in particular to the outlet channels 23 situated therein.

Here, the first current connection part 25 and the second current connection part 27 in each case have an inlet connection 35, via which the lower cooling fluid distributor 31, in particular the associated cooling fluid supply channel 33', is fluidically connected in each case to the first current connection part 25 and the second current connection part 27 respectively, in particular to the inlet channels 21 situated therein.

Furthermore, here, the first current connection part 25 and the second current connection part 27 in each case have an outlet connection 37, via which the lower cooling fluid distributor 31, in particular in each case the associated cooling fluid supply channel 33', is fluidically connected in each case to the first current connection part 25 and the second current connection part 27 respectively, in particular to the outlet channels 23 situated therein.

Optionally, the upper cooling fluid distributor 29 are/is formed so as to be electrically insulated in each case with respect to the at least one upper current bridge 17 and/or the first current connection part 25 and/or the second current connection part 27. Alternatively or in addition, optionally, the lower cooling fluid distributor 31 are/is formed so as to be electrically insulated in each case with respect to the at least one lower current bridge 19 and/or the first current connection part 25 and/or the second current connection part 27. In the exemplary embodiment as per FIG. 1, the upper cooling fluid distributor 29 is formed so as to be electrically insulated in each case with respect to the upper current bridges 17. The lower cooling fluid distributor 31 is formed so as to be electrically insulated in each case with respect to the lower current bridges 19, the first current connection part 25 and the second current connection part 27.

Optionally, the at least one upper current bridge 17 and/or the first current connection part 25 and/or the second current connection part 27 are/is arranged on the upper cooling fluid distributor 29, preferably in a recess 39 of the upper cooling fluid distributor 29. Alternatively or in addition, optionally, the at least one lower current bridge 19 and/or the first current connection part 25 and/or the second current connection part 27 are/is arranged on the lower cooling fluid distributor 31, preferably in a recess 39' of the lower cooling fluid distributor 31.

In the exemplary embodiment as per FIG. 1, the upper current bridges 17 are arranged on the upper cooling fluid distributor 29 in recesses 39 of the upper cooling fluid distributor 29. In particular, the upper current bridges 17 lie against the upper cooling fluid distributor 29 in the corresponding recesses 39. Furthermore, the lower current bridges 19, the first current connection part 25 and the second current connection part 27 are arranged on the lower cooling fluid distributor 31 in recesses 39' of the lower cooling fluid distributor 31. In particular, the lower current bridges 19, the first current connection part 25 and the second current connection part 27 lie against the lower cooling fluid distributor 31 in the corresponding recesses 39'. For the sake of clarity, only the recesses 39, 39' assigned to the upper current bridge 17 on the far left—in each case from the viewer's perspective—and to the lower current bridge 19 on the far left, to the first current connection part 25 and to the second current connection part 27 are denoted by a reference designation.

FIG. 2 schematically illustrates a detail of the diode laser arrangement 1 as per FIG. 1. Identical and functionally identical elements are denoted by the same reference designations, such that, in this regard, reference is made to the description above. The third stack 3.3 is shown here by way of example. The upper cooling device 7 and the lower cooling device 9 have in each case a schematically illustrated cooling channel structure with a multiplicity of cooling fluid channels 40, which are formed in particular in a manner typical for microchannel coolers. For example, the cooling fluid channels 40 each have an inner diameter of less than 1 mm, preferably less than 0.5 mm. The cooling fluid channels 40 are in each case fluidically connected to assigned inlet channels 21 and outlet channels 23 and form part of an upper cooling fluid circuit and lower cooling fluid circuit, respectively, of the type discussed. In FIG. 2, in the case of an illustrated cooling fluid circuit section above and below the diode laser device 5, the inlet channel 21 and the outlet channel 23 are in each case illustrated, for the sake of clarity, as lying in an image plane, that is to say adjacent to one another. Preferably, however, the inlet channel 21 and the outlet channel 23 are arranged substantially in a plane which lies in the vertical direction perpendicular to the image plane. For example, the inlet channel 21 is—from the viewer's perspective—arranged behind the image plane and the outlet channel 23 is arranged in front of the image plane. The outlet channel 23 is then, by way of example, arranged closer than the inlet channel 21 to an exit facet at which the laser beam exits the diode laser device 5. By means of the cooling fluid circulating in the corresponding cooling fluid circuit, the cooling devices 7, 9 and thus the diode laser device 5 can be cooled.

Figure 3:
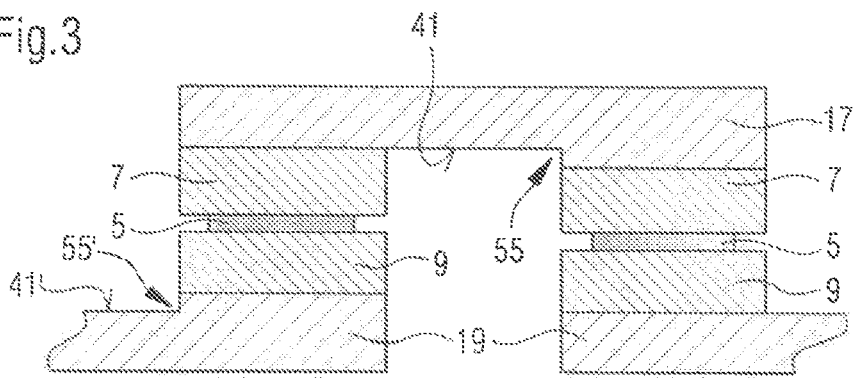
FIG. 3 is a schematic illustration of a detail of a second exemplary embodiment of a diode laser arrangement.

FIG. 3 schematically illustrates an exemplary detail of a second exemplary embodiment of the diode laser arrangement 1. Identical and functionally identical elements are denoted by the same reference designations, such that, in this regard, reference is made to the description above. Here, the at least one upper current bridge 17 and the at least one lower current bridge 19 are in each case of stepped form, such that a height offset of the emitted laser beams owing to the alternating orientation of the diode laser devices 5, in particular of the corresponding emitters, is compensated. Such stepped configurations 55, 55' are formed in particular on a contact surface 41 of an upper current bridge 17 or on a contact surface 41' of a lower current bridge 19, wherein a contact surface 41, 41' then has two regions which are vertically offset with respect to one another and on which in each case one upper cooling device 7 and one lower cooling device 9 respectively are arranged. Owing to the vertical offset of the cooling devices 7, 9, there is in particular a resulting vertical offset of the respectively assigned diode laser devices 5, in particular of the respective emitters. Analogously, such a stepped configuration 55, 55' may also be provided on the first current connection part 25 or the second current connection part 27 in order to vertically position a cooling device 7, 9 arranged thereon.

Figure 4:
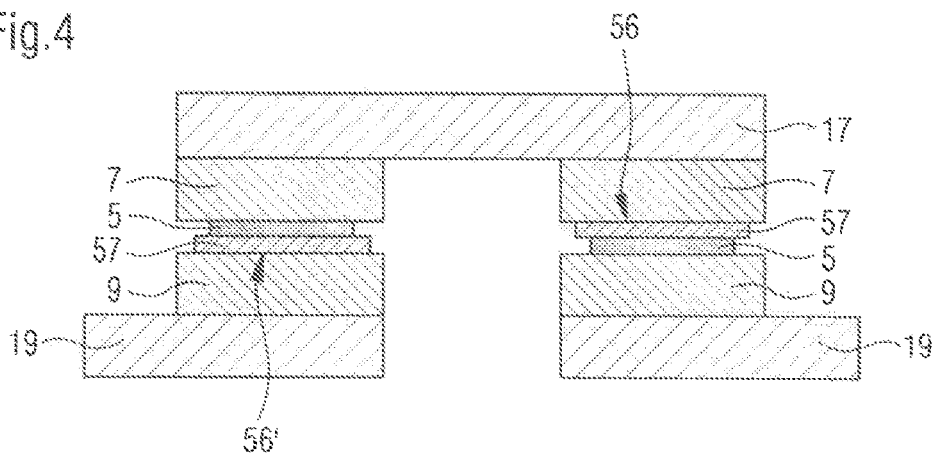
FIG. 4 is a schematic illustration of a detail of a third exemplary embodiment of a diode laser arrangement.

FIG. 4 schematically illustrates an exemplary detail of a third exemplary embodiment of the diode laser arrangement 1. Identical and functionally identical elements are denoted by the same reference designations, such that, in this regard, reference is made to the description above. Here, submounts 57 arranged alternately on a top side 56 or a bottom side 56' of a diode laser device 5 are provided. In particular, the submounts 57 are arranged on the at least one emitter on a top side 56 or a bottom side 56'. In this way, the diode laser devices 5, in particular the respective emitters, can in each case be arranged relative to one another such that a height offset of the emitted laser beams is compensated. It is self-evident that diode laser devices 5 of the type discussed may also have submounts 57 which are provided, for example, for improved heat transfer, wherein no vertical displacement of the diode laser devices 5 is effected.

Figure 5:
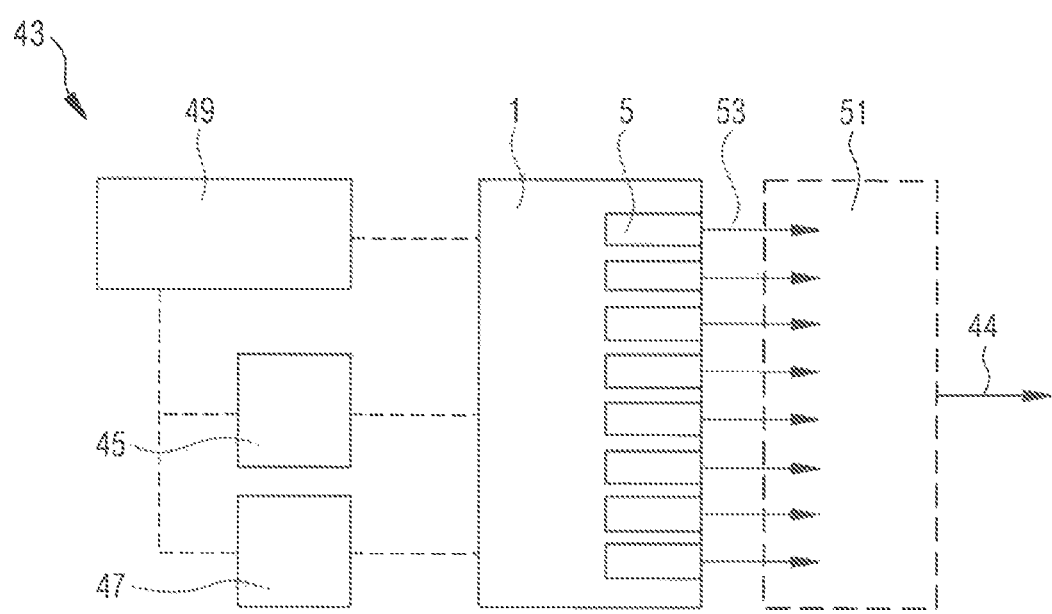
FIG. 5 is a schematic illustration of an exemplary embodiment of a DWM module with a diode laser arrangement.

FIG. 5 schematically illustrates an exemplary embodiment of a DWM module 43 for dense wavelength multiplexing. Identical and functionally identical elements are denoted by the same reference designations, such that, in this regard, reference is made to the description above. The DWM module 43 is configured in particular to generate a coupled-out laser beam 44. The DWM module 43 has a diode laser arrangement 1 according to the exemplary embodiments described above.

The DWM module 43 optionally has a cooling unit 45 for the cooling and treatment of cooling fluid. The cooling unit 45 is in particular configured to supply cooling fluid to the diode laser arrangement 1 and to cool the diode laser devices 5. Optionally, the cooling unit 45 is also configured to deionize the cooling fluid, which is in particular water.

Optionally, the DWM module 43 has a driving device 49 which is configured to drive, in particular control in open-loop or closed-loop fashion, in particular the cooling unit 45 and the diode laser arrangement 1. For example, the driving device 49 may be operatively connected to sensors which the diode laser arrangement 1 optionally has, wherein closed-loop temperature control and/or closed-loop power control of the diode laser devices 5 is realized by means of the sensors.

Optionally, the DWM module 43 has an energy supply device 47 which is configured to supply electrical current in particular to the diode laser arrangement 1, the cooling unit 45 and the driving device 49.

The DWM module 43 optionally has a beamforming device 51 which is configured to collimate the laser beams 53 emitted by means of the diode laser devices 5 into one coupled-out, in particular composite or combined, laser beam 44. For the sake of clarity, only one diode laser device 5 and one emitted laser beam 53 are denoted with a reference designation. In order to collimate the laser beams 53, the beamforming device 51 has, for example, corresponding optical devices.

Overall, it can be seen that an output power of the diode laser devices 5 can be significantly increased by means of the diode laser arrangement 1 according to the invention and the DWM module 43.

The invention claimed is:

1. A diode laser configuration for a cooling of and supply of electrical current to diode laser devices, the diode laser configuration comprising:
    at least two stacks each having a diode laser device configured to emit a laser beam, an upper cooling device, and a lower cooling device, wherein in each case, said diode laser device is disposed on said upper cooling device and on said lower cooling device such that said diode laser device is disposed between said upper cooling device and said lower cooling device, wherein said upper cooling device and said lower cooling device are in each case configured to cool said diode laser device disposed therebetween, wherein said upper cooling device and said lower cooling device are in each case electrically connected to said diode laser device disposed therebetween, wherein said upper cooling device and/or said lower cooling device of a stack of said stacks is in each case formed as a microchannel cooler, and wherein said upper cooling device and/or said lower cooling device of said stack in each case having substantially no electrical insulation with respect to said diode laser device disposed therebetween; and
    at least one upper current bridge and/or at least one lower current bridge being in each case configured to conduct the electrical current, wherein in each case two mutually adjacently disposed upper cooling devices are disposed on said at least one upper current bridge and are electrically connected to one another via said at least one upper current bridge, and/or two mutually adjacently disposed lower cooling devices are disposed on said at least one lower current bridge and are electrically connected to one another via said at least one lower current bridge.

2. The diode laser configuration according to claim 1, wherein said diode laser devices of said at least two stacks are disposed laterally adjacent to one another.

3. The diode laser configuration according to claim 1, wherein said diode laser devices of said at least two stacks are electrically connected in series.

4. The diode laser configuration according to claim 1, wherein said diode laser devices of said at least two stacks are in each case disposed with alternating orientation with regard to a p-side and an n-side.

5. The diode laser configuration according to claim 1, wherein in each case two adjacent ones of said stacks are disposed spaced apart from one another.

6. The diode laser configuration according to claim 1, further comprising a cooling fluid, in each case the cooling fluid can be conducted through said upper cooling device and/or said lower cooling device, the cooling fluid is in each case not electrically insulated with respect to an electrical-current-carrying part of said upper cooling device and/or of said lower cooling device at least in certain sections.

7. The diode laser configuration according to claim 6, wherein the cooling fluid contains deionized water or is composed of said deionized water.

8. The diode laser configuration according to claim 1, further comprising a first current connection part and a second current connection part which are in each case configured to conduct the electrical current, wherein said first current connection part is disposed on said upper cooling device or said lower cooling device of a first stack of said at least two stacks and is electrically connected thereto, and wherein said second current connection part is disposed on said upper cooling device or said lower cooling device of a final stack of said at least two stacks and is electrically connected thereto.

9. The diode laser configuration according to claim 8, wherein said at least one upper current bridge and/or said at least one lower current bridge and/or said first current connection part and/or said second current connection part are/is in each case formed so as to be capable of being flowed through by a cooling fluid.

10. The diode laser configuration according to claim 9, wherein said at least one upper current bridge and/or said at least one lower current bridge and/or said first current connection part and/or said second current connection part are/is coolable in each case by means of the cooling fluid.

11. The diode laser configuration according to claim 9, further comprising an upper cooling fluid distributor and/or a lower cooling fluid distributor which are/is in each case configured for conducting a cooling fluid, wherein at least two said upper cooling devices are in each case fluidically connected, via said upper current bridge and/or said first current connection part and/or said second current connection part, to said upper cooling fluid distributor, and/or at least two said lower cooling devices are in each case fluidically connected, via said lower current bridge and/or said first current connection part and/or said second current connection part, to said lower cooling fluid distributor.

12. The diode laser configuration according to claim 8, further comprising an upper cooling fluid distributor and/or a lower cooling fluid distributor which are in each case configured for conducting a cooling fluid, wherein at least two said upper cooling devices are in each case fluidically connected to said upper cooling fluid distributor, and/or said at least two said lower cooling devices are in each case fluidically connected to said lower cooling fluid distributor.

13. The diode laser configuration according to claim 12, wherein said upper cooling fluid distributor is formed so as to be electrically insulated in each case with respect to said at least one upper current bridge and/or said first current connection part and/or said second current connection part, and/or said lower cooling fluid distributor is formed so as to be electrically insulated in each case with respect to said at least one lower current bridge and/or said first current connection part and/or said second current connection part.

14. The diode laser configuration according to claim 12, wherein said at least one upper current bridge and/or said first current connection part and/or said second current connection part are/is disposed on said upper cooling fluid distributor, and/or said at least one lower current bridge and/or said first current connection part and/or said second current connection part are/is disposed on said lower cooling fluid distributor.

15. The diode laser configuration according to claim 12, wherein:
    said upper cooling fluid distributor has a recess formed therein;

said lower cooling fluid distributor has a recess formed therein; and said at least one upper current bridge and/or said first current connection part and/or said second current connection part are/is disposed in said recess of said upper cooling fluid distributor, and/or said at least one lower current bridge and/or said first current connection part and/or said second current connection part are/is disposed in said recess of said lower cooling fluid distributor.

16. The diode laser configuration according to claim 1, wherein said at least one upper current bridge and/or said at least one lower current bridge are/is in each case of stepped form, such that a height offset of emitted laser beams owing to an alternating orientation of said diode laser devices is compensated.

17. A dense wavelength multiplexing (DWM) module for generating a coupled-out laser beam, comprising:

a diode laser configuration according to claim 1.

* * * * *